(12) United States Patent
Tedeschi et al.

(10) Patent No.: US 10,515,862 B2
(45) Date of Patent: Dec. 24, 2019

(54) WAFER BASED CORROSION AND TIME DEPENDENT CHEMICAL EFFECTS

(71) Applicant: APPLIED MATERIALS, INC., Santa Clara, CA (US)

(72) Inventors: Leonard Tedeschi, San Jose, CA (US); Benjamin Schwarz, San Jose, CA (US); Changhun Lee, San Jose, CA (US); Ping Han Hsieh, San Jose, CA (US); Adauto Diaz, Saratoga, CA (US); Daniel T. McCormick, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 41 days.

(21) Appl. No.: 15/480,337

(22) Filed: Apr. 5, 2017

(65) Prior Publication Data
US 2018/0294200 A1  Oct. 11, 2018

(51) Int. Cl.
*H01L 23/58* (2006.01)
*H01L 21/66* (2006.01)
*H01L 21/67* (2006.01)
*H01L 23/522* (2006.01)
*H01L 23/64* (2006.01)

(52) U.S. Cl.
CPC ........ *H01L 22/34* (2013.01); *H01L 21/67028* (2013.01); *H01L 21/67253* (2013.01);
(Continued)

(58) Field of Classification Search
CPC ......... H01L 22/34; H01L 22/20; H01L 22/14; H01L 21/67253; H01L 22/26;
(Continued)

(56) References Cited

U.S. PATENT DOCUMENTS 4,710,550 A * 12/1987 Kranbuehl ........... B01J 19/0006
324/690
5,440,238 A   8/1995 Martens et al.
(Continued)

OTHER PUBLICATIONS

International Search Report and Written Opinion from PCT/US2018/024964 dated Jul. 17, 2018, 10 pgs.
(Continued)

*Primary Examiner* — Shouxiang Hu
(74) *Attorney, Agent, or Firm* — Schwabe, Williamson & Wyatt, P.C.

(57) ABSTRACT

Embodiments may also include a residual chemical reaction diagnostic device. The residual chemical reaction diagnostic device may include a substrate and a residual chemical reaction sensor formed on the substrate. In an embodiment, the residual chemical reaction sensor provides electrical outputs in response to the presence of residual chemical reactions. In an embodiment, the substrate is a device substrate, and the sensor is formed in a scribe line of the device substrate. In an alternative embodiment, the substrate is a process development substrate. In some embodiments, the residual chemical reaction sensor includes, a first probe pad, wherein a plurality of first arms extend out from the first probe pad, and a second probe pad, wherein a plurality of second arms extend out from the second probe pad and are interdigitated with the first arms.

6 Claims, 6 Drawing Sheets

(52) U.S. Cl.
CPC .............. *H01L 22/10* (2013.01); *H01L 22/12* (2013.01); *H01L 22/20* (2013.01); *H01L 22/26* (2013.01); *H01L 23/5222* (2013.01); *H01L 23/5223* (2013.01); *H01L 23/5228* (2013.01); *H01L 23/642* (2013.01); *H01L 23/647* (2013.01); *H01L 22/14* (2013.01)

(58) Field of Classification Search
CPC ... H01L 22/12; H01L 21/67028; H01L 22/10; H01L 23/5222; H01L 23/5223; H01L 23/5228; H01L 23/642; H01L 23/647
See application file for complete search history.

(56) References Cited

U.S. PATENT DOCUMENTS

| | | | |
|---|---|---|---|
| 5,723,875 A | | 3/1998 | Abe et al. |
| 5,731,697 A | * | 3/1998 | Li .............................. G01B 7/06 324/230 |
| 6,624,642 B1 | | 9/2003 | Lyons et al. |
| 6,723,572 B2 | | 4/2004 | Yano et al. |
| 6,911,828 B1 | | 6/2005 | Brossia et al. |
| 8,253,422 B2 | * | 8/2012 | Vermeire .......... H01L 21/67288 324/525 |
| 2002/0015146 A1 | | 2/2002 | Meeks et al. |
| 2005/0264798 A1 | | 12/2005 | Nishiyama et al. |
| 2006/0062897 A1 | | 3/2006 | Gu et al. |
| 2010/0077839 A1 | * | 4/2010 | Trentzsch ............ G01N 27/221 73/31.03 |
| 2011/0180106 A1 | | 7/2011 | Vermeire et al. |
| 2012/0276817 A1 | | 11/2012 | Iravani et al. |

OTHER PUBLICATIONS

International Preliminary Report on Patentability from PCT/US2018/024964 dated Oct. 17, 2019, 7 pgs.

\* cited by examiner

WAFER BASED CORROSION AND TIME DEPENDENT CHEMICAL EFFECTS

BACKGROUND

1) Field

Embodiments relate to the field of semiconductor manufacturing and, in particular, to systems and methods for providing real time monitoring of residual reactions on a substrate after a processing operation has been implemented.

2) Description of Related Art

Subsequent to some processing operations in semiconductor manufacturing, there may be residual chemical reactions that persist on the substrate. These residual chemical reactions may adversely affect the performance of a semiconductor device. For example, residual chemical reactions may result in corrosion, changes in the properties of the film, or defects. Conversely, some deposited films may require chemical conversion post deposition to a final state prior to subsequent processing operations. However, the residual chemical reaction that is occurring post processing may not always be well understood. For example, the residual chemical reactions may proceed at an unknown rate and/or be dependent on the conditions in which the semiconductor device is stored, such as temperature, humidity, exposure to gasses in the atmosphere, or the like. Accordingly, the ability to quantify the results of the chemical reactions in real time may provide the ability to optimize process conditions to minimize residual chemical reactions and/or optimize process flows and yields.

However, there are no devices currently available that can measure the effects of the residual chemical reactions in real time. Some techniques exist to determine these effects, for example, a defect inspection system may be used to determine the increase in defects over time, or the film thickness may be measured with an ellipsometer to determine differences over time. Unfortunately, these measurements require handling the semiconductor device and can only provide discrete measurements over the duration the devices are monitored.

SUMMARY

Embodiments includes systems and methods for determining the presence of residual chemical reactions on processed substrates. In an embodiment, a method for determining the presence of residual chemical reactions, may include forming a sensor on a substrate. In an embodiment, the method may further include placing the substrate in a testing chamber. After the substrate is placed in a testing chamber, embodiments may include executing a diagnostic procedure on the substrate where electrical outputs from the sensor are recorded during the diagnostic procedure. Thereafter, embodiments may include determining a subsequent processing operation based on the recorded electric outputs from the sensor.

Embodiments may also include methods where the substrate is a process development substrate and methods where the substrate is a production substrate. According to an embodiment, when the substrate is a production substrate, the sensor may be formed in the scribe line of the substrate. According to an embodiment, the diagnostic procedure includes monitoring changes to one or more of a capacitance, a capacitance noise floor, a charge measurement, a leakage current, a breakdown voltage, and a resistance.

Embodiments may also include a residual chemical reaction diagnostic device. The residual chemical reaction diagnostic device may include a substrate and a residual chemical reaction sensor formed on the substrate. In an embodiment, the residual chemical reaction sensor provides electrical outputs in response to the presence of residual chemical reactions. In an embodiment, the substrate is a device substrate, and the sensor is formed in a scribe line of the device substrate. In an alternative embodiment, the substrate is a process development substrate. In some embodiments, the residual chemical reaction sensor includes, a first probe pad, wherein a plurality of first arms extend out from the first probe pad, and a second probe pad, wherein a plurality of second arms extend out from the second probe pad and are interdigitated with the first arms.

DETAILED DESCRIPTION

Figure 1A:
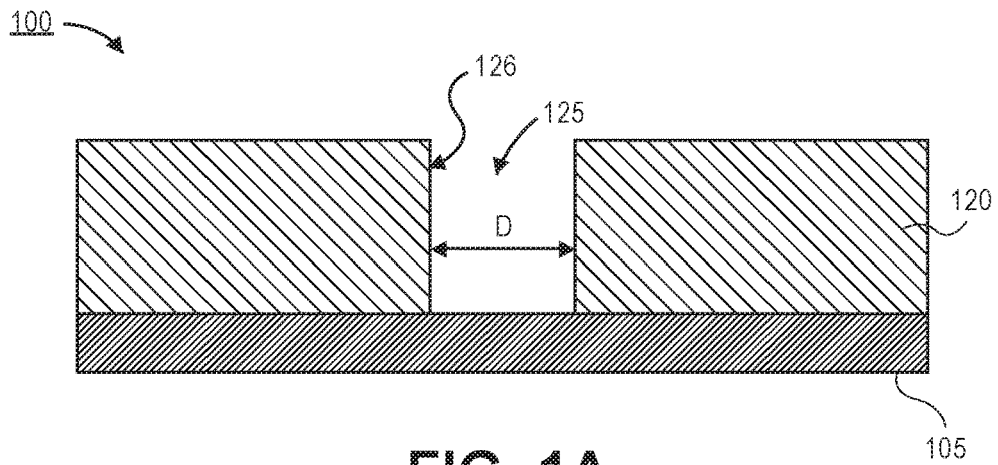
FIG. 1A is a cross-sectional illustration of a patterned stack of materials formed over a substrate, according to an embodiment.

Systems and methods for using a structures fabricated onto substrates to provide monitoring of corrosion and other time dependent chemical reactions are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, residual chemical reaction may adversely affect the processing of some devices fabricated with semiconductor processing techniques. These residual chemical reactions may result in decreased yields since the entire process is not fully characterized. For example, after a material layer has been patterned (e.g., with an etching process) a residual chemical reaction, such as corrosion, may proceed after the substrate is removed from the processing chamber. In such situations, the corrosion may alter the pattern formed in the material layer and result in defects. Accordingly, embodiments described herein provide for systems and methods for characterizing these residual chemical reactions.

In one embodiment, the residual chemical reactions are characterized prior to fabricating active devices. In such embodiments, one or more sensors may be patterned onto a process development substrate. The sensors may be formed from the same material layer or layers that will be present on the devices and fabricated with the same processing operations used to fabricate the devices that are being investigated. Accordingly, the sensors can then be monitored to provide information that is directly related to the processing conditions that the devices will be exposed to as well. The information can, therefore, be used to refine the processing operations to minimize a residual chemical reaction or to be used to quantify the residual chemical reaction so that the effects of the residual chemical reaction can be accounted for in the design of the device.

In an alternative embodiment, the residual chemical reactions may be monitored in parallel with the production of active devices. For example, one or more sensors may be fabricated in a scribe line or any other area of a production substrate. In order to predict the effect of the residual chemical reaction on the active devices, the residual chemical reaction may be accelerated at the sensor location. In some embodiments, the residual chemical reaction may be accelerated by providing a localized stimulus (e.g., voltage, current, moisture, chemical species, or the like) to the sensor. Accordingly, the accelerated residual chemical reaction may be monitored to determine if the residual chemical reaction will negatively affect the active devices. In an embodiment, the data obtained from the sensor may then be used to inform decisions on whether to rework the production substrate, scrap the production substrate, initiate an additional processing operation (e.g., to add a processing operation designed to slow or stop a residual chemical reaction, or the like). As such, the yield of a process may be improved since the full process (including residual chemical reactions) may be quantified earlier and with more precision.

Furthermore, it is to be appreciated that sensors formed in accordance with embodiments described herein do not need as much handling as the defect inspection systems described above, in addition to providing continuous monitoring as opposed to discrete measurements. Particularly, embodiments include forming sensors that receive electrical inputs (e.g., bias voltage, current, or the like) from a probe and provide electrical signal outputs. For example, the sensors may be designed to provide outputs, such as capacitance, resistance, breakdown voltage, current leakage, noise levels, or the like. These outputs may be continuously recorded, and changes to the outputs over time may be used to determine the presence and extent of one or more residual chemical reactions, as will be described in greater detail below. Additionally, environmental condition may also be controlled to further quantify residual chemical reactions and/or to determine conditions that reduce or eliminate the residual chemical reactions.

Referring now to FIGS. 1A-1D, exemplary illustrations of the effect of residual chemical reactions on a material stack after it has been processed is shown, according to an embodiment. In FIG. 1A, a cross-sectional illustration of a device 100 after it has been processed is shown, according to an embodiment. The device 100 includes a material stack 120 that has been patterned, (e.g., with an etching process) to form a trench 125 through the material stack 120. In the illustrated embodiment, the material stack 120 is shown as a single material layer formed over a substrate 105. However, embodiments may include a material stack 120 that includes one or more material layers formed with one or more different materials. According to an embodiment, the material layers may include metals, semiconductors, composite dielectrics, insulators, organic layers, or any other material. In an embodiment, the substrate 105 may be any suitable substrate, such as a semiconductor substrate (e.g., silicon, or a III-V semiconductor), a glass substrate, a sapphire substrate, or any other material. In some embodiments, substrate 105 may include multiple layers, such as a silicon on insulator (SOI) substrate.

Figure 1B:
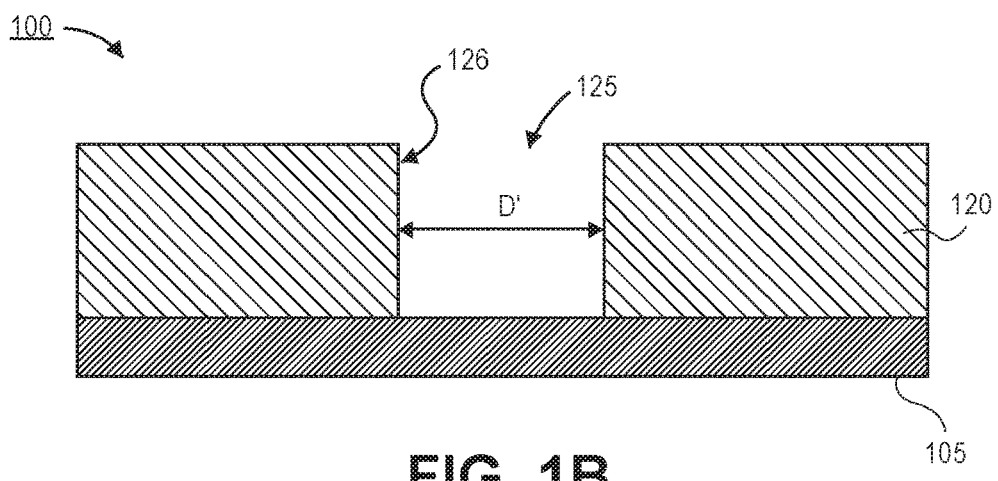
FIG. 1B is a cross-sectional illustration of the patterned stack of materials in FIG. 1A after a residual chemical reaction has changed the dimensions of a trench in the patterned stack of materials, according to an embodiment.

In an embodiment, the trench 125 is defined by sidewall surfaces 126 of the material stack 120. In an embodiment, the semiconductor device 100 is processed so that the sidewalls 126 are spaced apart from each other by a distance D. However, as described above, residual chemical reactions that continue after a processing operation is completed may continue to alter material stack 120. For example, a residual chemical reaction may include corrosion which continues to alter the material stack 120. As shown in FIG. 1B, the sidewalls 126 may be spaced apart from each other by a distance D' that is greater than the distance D after the residual chemical reactions have continued for some period of time. Accordingly, the residual chemical reaction may alter the structure of the device. In some instances, this change results in deteriorated functionality, or may even result in non-functioning devices. The ability to accurately predict the result such of residual chemical reactions over a period of time under given conditions and/or reduce the effects of the residual chemical reactions provides the ability to account for known changes after processing and improve overall process control.

Figure 1C:
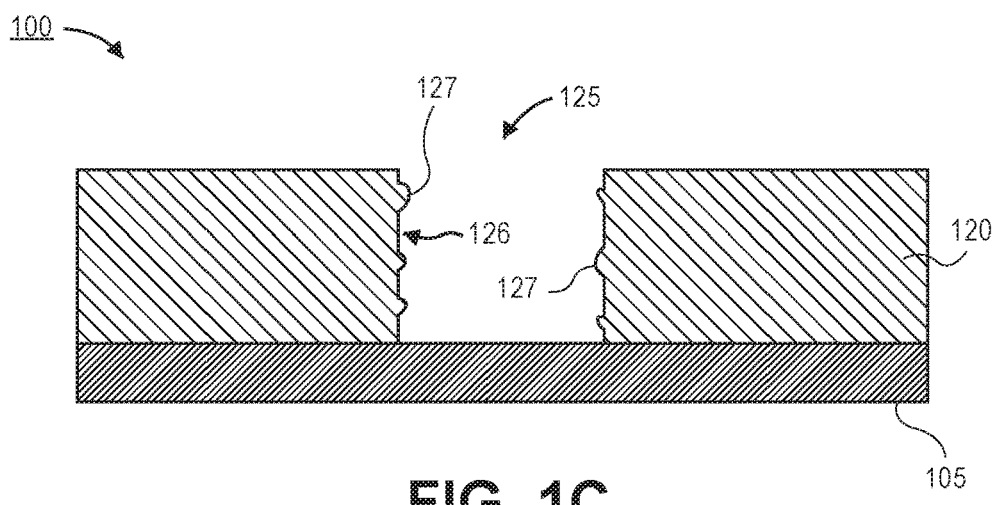
FIG. 1C is a cross-sectional illustration of the patterned stack of materials in FIG. 1A after a residual chemical reaction has resulted in the formation of nodules along sidewalls of a trench in the patterned stack of materials, according to an embodiment.

It is to be appreciated that residual chemical reactions may not alter the surfaces of a material uniformly. For example, the residual chemical reaction may also be localized and not produce a uniform alteration to the material stack 120 similar to what is illustrated in FIG. 1B. For example, corrosion may be a localized reaction and result in pitting or the formation of nodules on a surface. Such an embodiment is illustrated in FIG. 1C. As illustrated, the sidewalls 126 of the patterned material stack 120 have developed a plurality of nodules 127. Due to the localized nature of the nodule formation, it may not be evident that there is a distinct change in the spacing between the sidewalls 126. However, as described in greater detail below, sensors formed in accordance with embodiments described herein may utilize changes in electrical properties caused by nodules to determine the existence of residual chemical reactions.

Figure 1D:
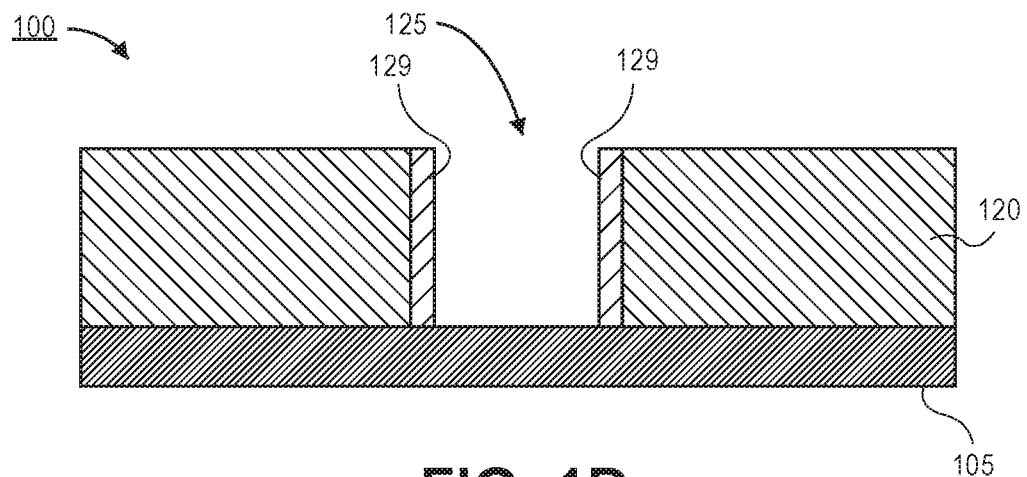
FIG. 1D is a cross-sectional illustration of a patterned stack of materials that has residual etch byproducts formed along sidewalls of a trench, according to an embodiment.

Additionally, it is to be appreciated that patterning processes, such as etching, may also leave behind residual etch byproducts. Typically, these byproducts may be comprised of polymer materials. An example of such residual etch byproducts is illustrated in FIG. 1D. In the illustrated embodiment, a polymer layer 129 may be formed along the sidewalls 126 of the patterned material stack 120. Polymer layers 129 are typically more susceptible to absorbing moisture or other molecules, burning off at elevated temperatures, or being modified in many different environments. Additionally, as the polymer layers 129 are modified, changes to electrical properties of the material stack 120 may also be observed with sensors formed in accordance with embodiments described herein. Accordingly, these changes may yield false positives. As such, embodiments include processes for identifying when sensor readings are indicative of changes to the residual etch byproducts instead of residual chemical reactions.

Figure 2A:
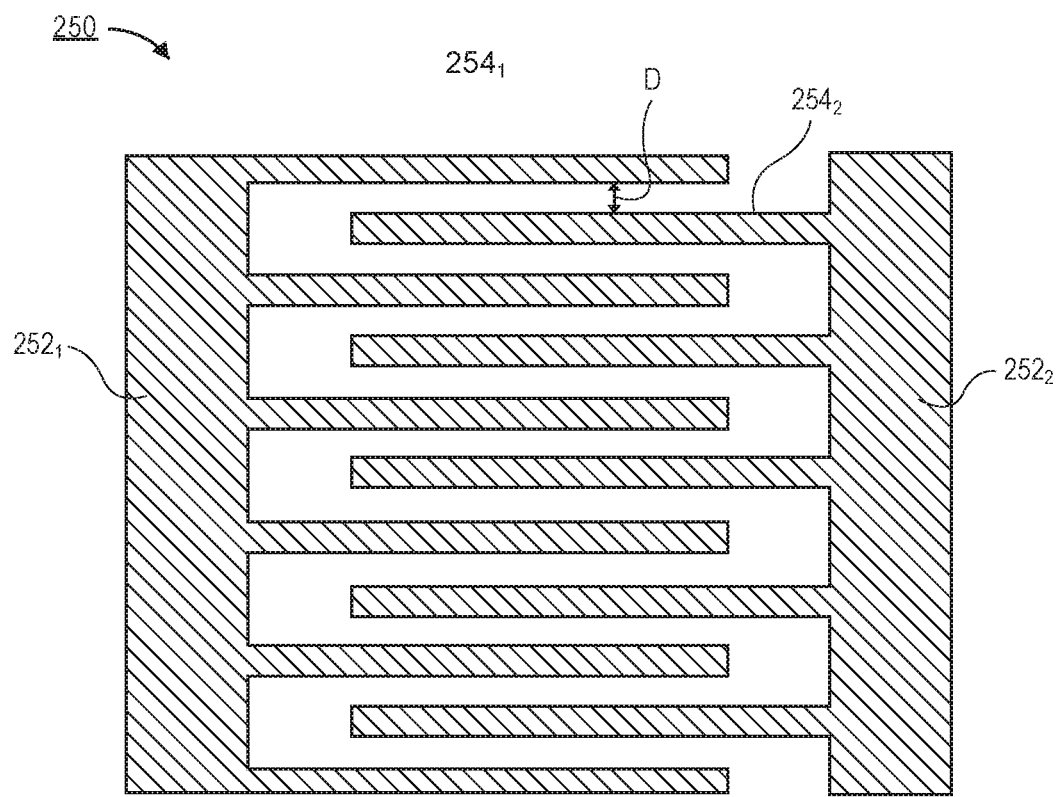
FIG. 2A is a plan view illustration of a sensor that may be patterned into a stack of materials on a substrate, according to an embodiment.
Figure 2B:
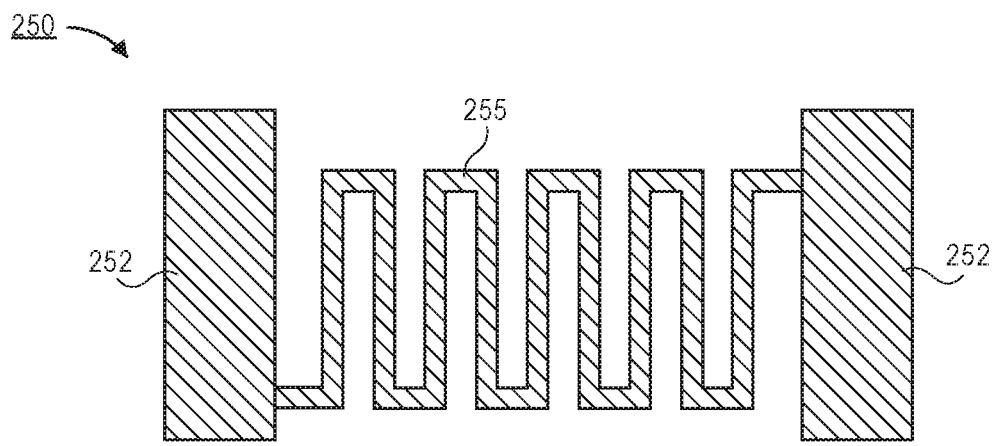
FIG. 2B is a plan view illustration of an alternative sensor that may be patterned into a stack of materials on a substrate, according to an embodiment.

Referring now to FIGS. 2A and 2B, plan view illustrations of exemplary sensors 250 that may be used to monitor residual chemical reactions are shown, according to various embodiments. In an embodiment, the sensors 250 may be patterned from a material stack, similar to the material stacks described above with respect to FIGS. 1A-1D. In an embodiment, the material stack used to form the sensors 250 may be the same material stack that is being investigated. Additionally, the processing operations used to pattern the material stack may be the same processing operations used to pattern devices. As such, any residual chemical reactions that are detected by the sensor will be substantially similar to residual chemical reactions that are present during the production of active devices.

Referring now to FIG. 2A, a plan view illustration of an exemplary sensor 250 that may be used to monitor residual reactions is shown, according to an embodiment. Sensor 250 may include a first probe pad $252_1$ and a second probe pad $252_2$. The probe pads 252 may be sized so that an external probe can be placed in contact with the sensor 250. In an embodiment, a plurality of first arms $254_1$ may extend from the first probe pad $252_1$ and a plurality of second arms $254_2$ may extend from the second probe pad $252_2$. The first arms $254_1$ and the second arms $254_2$ may be interdigitated with each other so that each arm 254 is separated from each a neighboring arm 254 by a distance D. The interdigitated arms allow for a capacitance to build in the sensor 250 when probes are used to apply current to the probe pads. It is to be appreciated that the structure of sensor 250 illustrated in FIG. 2A is exemplary in nature and embodiments may include sensors 250 with any number of interdigitated arms and with any desired dimensions depending on size constraints and the needs of the device.

Embodiments may include monitoring different electrical properties of the sensor 250 in order to detect residual chemical reactions. For example, changes to the capacitance of the sensor 250 may be caused by residual chemical reactions. Generally, a change to the capacitance of the sensor 250 may be caused by an increase or decrease in the distance D between the interdigitated arms 254. For example, the distance D between the interdigitated arms 254 may be caused by corrosion or residual etching. Additionally, a change in the breakdown voltage of the sensor 250 may be monitored. In some embodiments, the breakdown voltage may be altered by a change in the distance D or by the formation of nodules, such as those described with respect to FIG. 1C. While a few exemplary illustrations of how sensor 250 may be used to identify residual chemical reactions are provided here, a more thorough explanation of how the sensor may be used is provided in greater detail below.

Referring now to FIG. 2B, a sensor 250 according to an additional embodiment is shown. In FIG. 2B the sensor 250 may include two probe pads 252 that are electrically connected together by a trace 255. In an embodiment, the trace 255 may be any desired length or width, and follow any desired path between the probe pads 252. In the illustrated embodiment, the traces 255 includes a switchback pattern, though embodiments are not limited to such designs. A sensor 250 such as the one illustrated in FIG. 2B may be used to monitor changes to the resistance between the probe pads 252 in order to identify residual chemical reactions. For example, absorption or emission of different molecules may alter the resistance of the sensor 250.

Figure 3A:
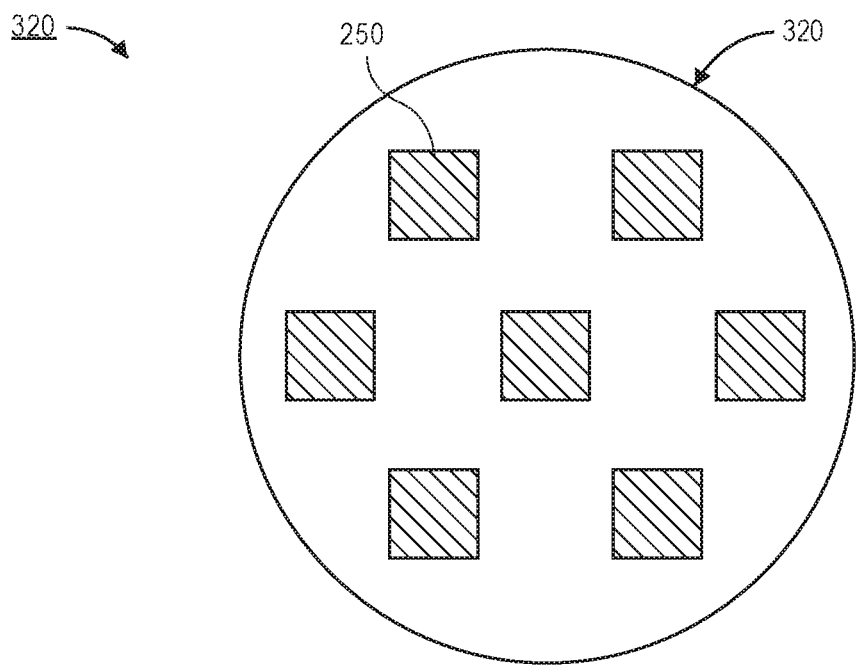
FIG. 3A is a plan view illustration of process development substrate that includes a plurality of sensors, according to an embodiment.
Figure 3B:
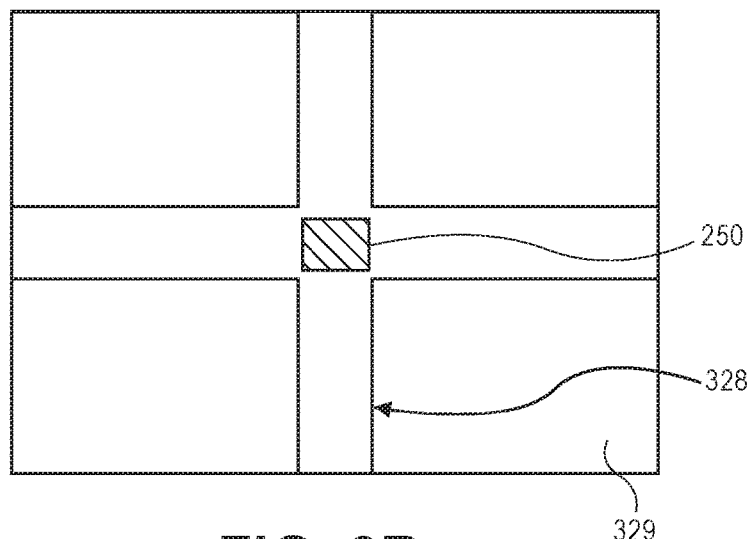
FIG. 3B is a plan view illustration of a portion of a production substrate that includes a sensor formed in a scribe line, according to an embodiment.

Referring now to FIGS. 3A and 3B, schematic illustrations show examples of where sensors 250 may be fabricated. In FIG. 3A, a plurality of sensors 250 are fabricated on a process development substrate 320. The sensors 250 are illustrated schematically as blocks, to indicate that any suitable sensor formed in accordance with embodiments may be used. The plurality of sensors 250 may be formed at multiple locations over the surface of a process development substrate 320. For example, the sensors may be formed proximate to the edge of the substrate 320 and/or proximate to a center of the substrate 320 in order to determine if there are differences in the residual chemical reactions at different locations across the substrate. Since there are no active devices being fabricated on a process development substrate 320, the sensors 250 are not restricted from being formed over any portion of the substrate. In the illustrated embodiment, seven sensors 250 are shown on the substrate 320, but it is to be appreciated that any number of sensors 250 (e.g., one or more sensors 250) may be formed on the substrate 320, according to an embodiment.

Referring now to FIG. 3B, a plan view schematic of a portion of a production substrate 321 is shown, according to an embodiment. The production substrate 321 may include a plurality of device regions 329 where the active devices may be fabricated. The device regions 329 may be separated from each other by scribe lines 328, as is known in the art. Embodiments may utilize the space in the scribe lines 328 to fabricate one or more sensors 250. Accordingly, sensors 250 for determining the presence of residual chemical reactions may be included in areas of a production substrate 321 that would otherwise not be used for producing functioning devices.

Figure 4:
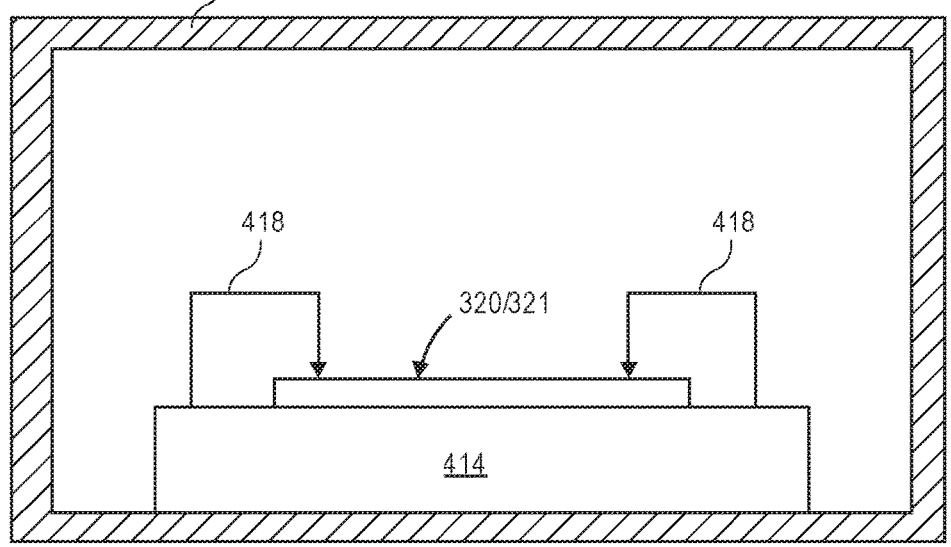
FIG. 4 is a cross-sectional schematic illustration of a testing chamber that may be used in conjunction with sensors formed on a production substrate or a process development substrate, according to an embodiment.

According to an embodiment, sensors 250 formed on production substrates 321 or process development substrates 320 may be monitored in a testing chamber. A schematic of a testing chamber 410 is illustrated in FIG. 4, according to an embodiment. In an embodiment, the testing chamber 410 may include an enclosure 412. The enclosure 412 may be substantially sealed in order to maintain desired environmental conditions. While not shown, the test conditions within the enclosure may be obtained by supplying gases, moistures, or fluids to the enclosure or changing the pressure within the enclosure. In an embodiment, the enclosure 412 may include windows through which electromagnetic radiation of a desired frequency may pass or a source of electromagnetic radiation may be included within the enclosure 412.

In an embodiment, the testing chamber 410 may include a plate 414 on which a substrate 320 and/or 321 may be placed. In an embodiment, the plate 414 may include heating and/or cooling elements in order to control a temperature of the substrate 320 and/or 321 during the testing. According to an embodiment, the plate 414 may include electronics (not shown) that are attached to probes 418. The probes 418 are able to contact the probe pads of the sensors formed on the substrate 320/321. In the illustrated embodiment, a single set of probes 418 are shown contacting the substrate 320/321, but it is to be appreciated that any number of probes 418 may be used to contact a plurality of sensors on a single substrate 320/321. In an additional embodiment, the testing chamber 410 may accommodate a plurality of substrates 320/321.

Figure 5:
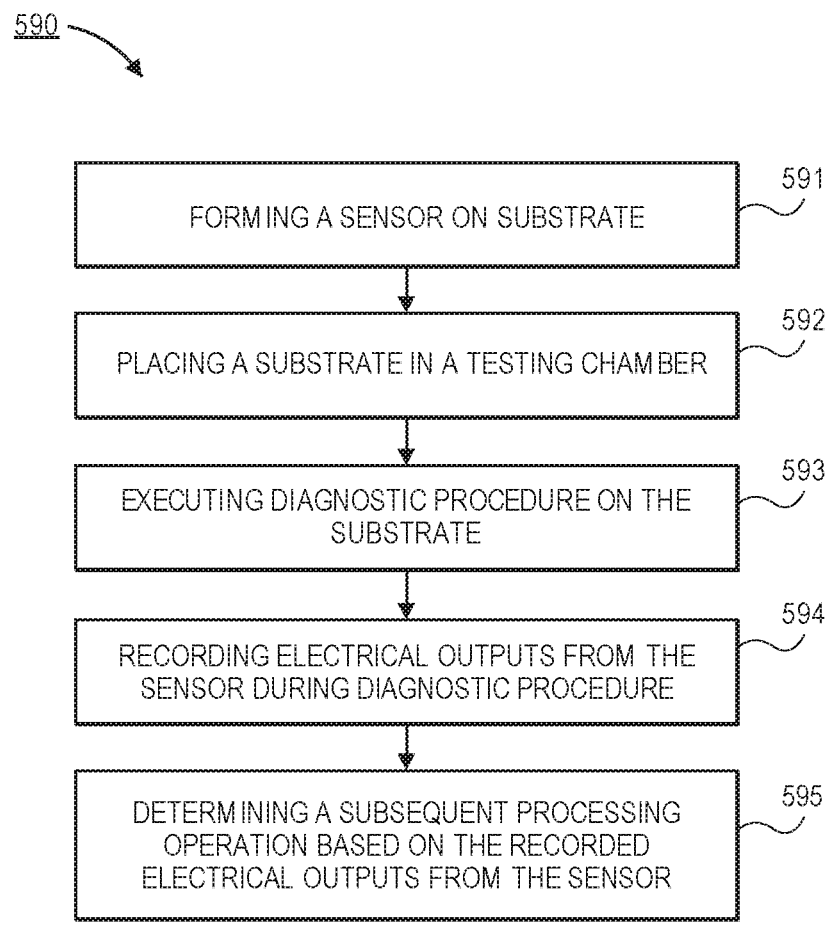
FIG. 5 is a process flow diagram that describes a process for using sensors on a production substrate or a process development substrate, according to an embodiment.

Referring now to FIG. 5, a process flow 590 for using sensors formed in accordance with embodiments described herein is shown. It is to be appreciated that sensors formed in accordance with embodiments described herein and used in accordance with process flow 590 do not need as much handling as the defect inspection systems described above. Additionally process flow 590 allows for continuous monitoring as opposed to discrete measurements. Particularly, embodiments include forming sensors that receive electrical inputs (e.g., bias voltage, current, or the like) from a probe and provide electrical signal outputs. For example, the sensors may be designed to provide outputs, such as capacitance, resistance, breakdown voltage, current leakage, noise levels, or the like. These outputs may be continuously recorded, and changes to the outputs over time may be used to determine the presence and extent of one or more residual chemical reactions. Additionally, environmental condition may also be controlled to further quantify residual chemical reactions and/or to determine conditions that reduce or eliminate the residual chemical reactions. In an embodiment, the process flow 590 may be used in conjunction with sensors 250 formed on production substrates 321 or for sensors formed on process development substrates 320.

According to an embodiment, the process may begin with operation 591 which includes forming a sensor 250 on a substrate. In an embodiment, the sensor 250 may be formed on a production substrate 321 or on a process development substrate. In either case, the sensor 250 may be formed by forming a material stack that is the same material stack used to formed active devices. The material stack may then be patterned with a patterning process (e.g., an etching process) that is substantially similar to the patterning process being investigated for residual chemical reactions. In embodiments where the sensor 250 is formed on a production substrate 321, the sensor 250 may be formed in parallel with the formation of active devices.

Referring now to operation 592, embodiments may include placing the substrate into a testing chamber 410, similar to the testing chamber described above with respect to FIG. 4. In an embodiment, placing the substrate into a testing chamber may include attaching the probes 418 to the probe pads 252 of the sensor 250.

Referring now to operation 593, embodiments may include executing a diagnostic procedure on the substrate. Embodiments may include any number of diagnostic procedures that may be useful in determining the presence of residual chemical reactions, how residual chemical reactions change over time, how residual chemical reactions respond to different stimulus, or the like. According to an embodiment, process 590 may include recoding electrical outputs from the sensor during the diagnostic procedure, as shown in operation 594.

Embodiments may include executing diagnostic procedures over any desired time period and under any desired environmental conditions. For example, the diagnostic procedures may be executed over a period of seconds, minutes, hours, days, weeks, etc. Additionally, the environmental conditions may be altered to identify conditions that reduce or eliminate residual chemical reactions. For example, environmental conditions, such as atmosphere (e.g., oxygen, inert gas, water vapor, etc.), pressure, temperature, or the like may be controlled during the execution of the diagnostic procedure. In an embodiment, the environmental conditions may be held constant during the diagnostic procedure, or the environmental conditions may be variable during the execution of the diagnostic procedure.

In one embodiment, the presence of a residual chemical reaction may be determined by executing a diagnostic procedure that includes monitoring the change in capacitance of a sensor 250. For example, if the capacitance of a sensor increases over time, it may be indicative of corrosion occurring on the sensor 250. Alternatively, if the capacitance of a sensor decreases over time, it may be indicative of residual etching of the sensor 250. Another indication of corrosion may be the presence of a wide noise floor in the capacitance reading. In another embodiment, an increase in the leakage current may also be indicative of corrosion being present. In an embodiment, a decrease in the breakdown voltage may be indicative of corrosion as well. With respect to breakdown voltage decreases, it is proposed that corrosion resulting in the presence of nodules on the surfaces of the sensor arms produce localized increases in electric field that lead to field emission or current arcing, and ultimately, in some instances, breakdown.

In an embodiment, the diagnostic procedure may include applying a single frequency to the probe pads in order to measure the behavior of the sensors 250. In additional embodiments, multiple frequencies may be used to measure the behavior of the sensors 250 (e.g., the different frequencies may be applied to the sensor concurrently, or a frequency sweep may be applied to the sensor).

However, it is to be appreciated that some changes to the capacitance, breakdown voltage, current leakage, or the like may not be entirely due to residual chemical reactions, such as corrosion. For example, residual etching byproducts may be a confounding factor that may need to be accounted for in order to determine if a residual chemical reaction is present. Particularly, the residual etching byproducts may be more susceptible to absorption, emission, thermal degradation, or the like. As these changes occur at the residual etch byproduct, the capacitances, breakdown voltages, and leakage current of the sensor may also change. Accordingly, embodiments include the integration of multiple sensor elements and diagnostic procedures that eliminate false positives attributable to the presence of residual etch byproducts.

In one embodiment, the diagnostic procedure may include changing the environmental conditions, such as moisture in the atmosphere, temperature of the substrate, pressure of the atmosphere, or the like. In such embodiments, if the signal of interest (e.g., breakdown voltage, capacitance, leakage current, etc.) changes in response to the environmental condition, then the change may be indicative of the presence of a residual etch byproduct instead of a residual chemical reaction. Accordingly, embodiments provide a process for eliminating false positives.

Referring now to operation 595, embodiments may include determining a subsequent processing operation based on the recorded electrical outputs from the sensor. For example, if excessive corrosion is present on the sensor, the subsequent processing operation may be to quench the substrate in order to minimize the corrosion. For example, the substrate may be quenched with a water vapor or any other reaction limiter. In an additional embodiment, the subsequent processing operation may be to change parameters of the etching process in order to minimize the residual chemical reaction on subsequently processed substrates.

It is to be appreciated that the residual chemical reactions may be substantially slow processes. For example, corrosion may proceed at a rate that does not result in substantial damage to the device until days or even weeks after the processing operation used to fabricate the device has been executed. Accordingly, embodiments may also include a diagnostic procedure that accelerates the residual chemical reactions. In one embodiment, executing the diagnostic procedure may include applying a stimulus to the sensor in order to accelerate the residual chemical reaction. For example, a bias voltage may be applied to the probe pads of the sensor. In an embodiment, a bias voltage of approximately 25 V or more, 50 V or more, or 75 V or more may be applied to the probe pads in order to accelerate the residual chemical reaction. In such embodiments, a determination of the presence and extent of the residual chemical reaction may be determined in minutes or hours instead of days or weeks, Such voltage bias acceleration diagnostic procedures may be particularly beneficial when used on device substrates. For example, a device may be fabricated and the voltage bias acceleration diagnostic procedure may be implemented on a sensor immediately following the fabrication of the device. If the sensor reports that the resulting residual chemical reactions are below a desired threshold, then the substrate may continue on to subsequent processing without needing to worry about subsequent residual chemical reactions damaging the final device. Alternatively, if the sensor reports that the resulting residual chemical reactions are above a desired threshold, then the substrate may be reworked, processed further to mitigate the effect of residual chemical reactions (e.g., quenching, etc.), or the substrate may be scrapped. Accordingly, a substrate that includes devices that will ultimately fail or be damaged will not continue on in the fabrication process, and overall yield may be increased.

While voltage bias acceleration diagnostic procedures is particularly beneficial for use on production substrates, it is to be appreciated that process development substrates also benefit from voltage bias acceleration diagnostic procedures. For example, the speed of process development may be increased since wait times to determine the presences and extent of residual chemical reactions may be reduced.

In addition to voltage being used as an accelerant, embodiments include many other accelerants that may be used. In one embodiment, moisture, dielectric fluids, engineered fluids (e.g., ions, acids, bases, PH), heat, gases, plasma induced ionic species, or the like may be used to accelerate a residual chemical reaction. In an embodiment, the accelerants may be formed over the sensor as a coating. Additional embodiments may include exposing the sensor to the accelerant (e.g., the accelerant is in the atmosphere surrounding the sensor, the accelerant is sprayed or otherwise deposited over the sensor, or the like. The choice of which accelerant to use may be dependent on the materials that are being processed, the processing operations being investigated, or the residual chemical reactions that are being investigated.

Figure 6:
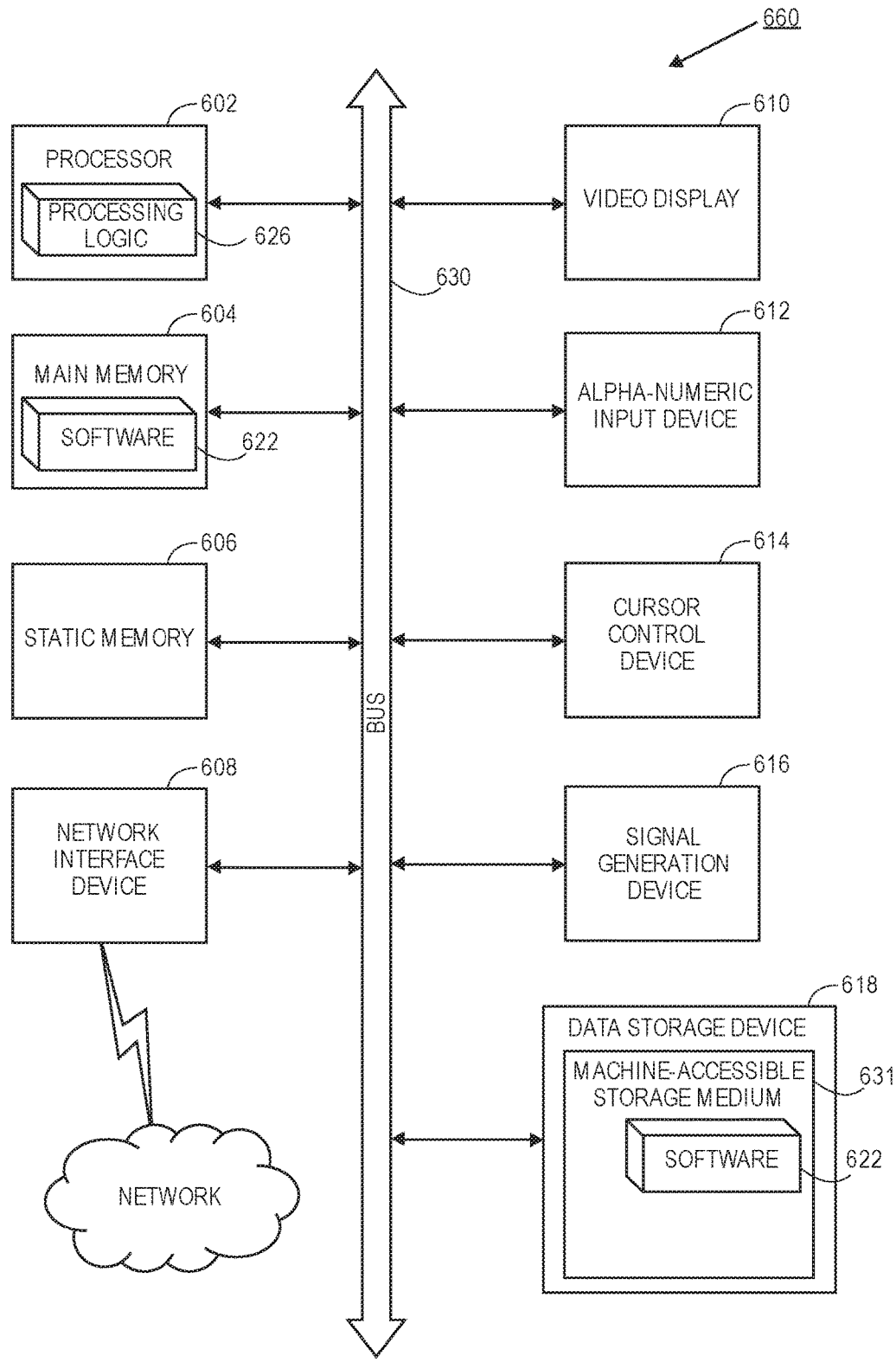
FIG. 6 illustrates a block diagram of an exemplary computer system that may be used in conjunction with processes that include monitoring residual chemical reactions, in accordance with an embodiment.

Referring now to FIG. 6, a block diagram of an exemplary computer system 660 of a processing tool is illustrated in accordance with an embodiment. In an embodiment, computer system 660 is coupled to and controls processing in the processing tool. Computer system 660 may be connected (e.g., networked) to other machines in a Local Area Network (LAN), an intranet, an extranet, or the Internet. Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 620 via the system network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A residual chemical reaction diagnostic device, comprising:
    a substrate;
    a material stack over the substrate; and
    a residual chemical reaction sensor formed into the material stack, wherein the residual chemical reaction sensor comprises:
        a first electrode with a first sidewall that extends an entire height of the material stack; and
        a second electrode with a second sidewall that extends an entire height of the material stack, wherein the residual chemical reaction sensor provides electrical outputs in response to the presence of residual chemical reactions.

2. The residual chemical reaction diagnostic device of claim 1, wherein the substrate is a device substrate, wherein the sensor is formed in a scribe line of the device substrate, and wherein the sensor is formed in parallel with the active devices on the device substrate, and wherein the sensor includes the same materials as the active devices.

3. The residual chemical reaction diagnostic device of claim 1, wherein the substrate is a process development substrate.

4. The residual chemical reaction diagnostic device of claim 1, wherein the residual chemical reaction sensor comprises:
    a first probe pad, wherein a plurality of first arms extend out from the first probe pad, wherein the first sidewall surface is along the plurality of first arms; and
    a second probe pad, wherein a plurality of second arms extend out from the second probe pad and are interdigitated with the first arms, wherein the second sidewall surface is along the plurality of second arms.

5. The residual chemical reaction diagnostic device of claim 1, wherein the residual chemical reaction sensor provides electrical outputs including a capacitance.

6. A residual chemical reaction diagnostic device, comprising:
    a substrate;
    a material stack over the substrate; and
    a residual chemical reaction sensor formed into the material stack, wherein the residual chemical reaction sensor comprises:
        a first electrode with a first sidewall that extends an entire height of the material stack; and
        a second electrode with a second sidewall that extends an entire height of the material stack, wherein the residual chemical reaction sensor provides electrical outputs in response to the presence of residual chemical reactions, wherein the residual chemical reaction sensor provides electrical outputs including a capacitance, and wherein the residual chemical reaction sensor further comprises:
        a first probe pad, wherein a plurality of first arms extend out from the first probe pad, wherein the first sidewall surface is along the plurality of first arms, and
        a second probe pad, wherein a plurality of second arms extend out from the second probe pad and are interdigitated with the first arms, wherein the second sidewall surface is along the plurality of second arms.

* * * * *